US012212331B2

(12) United States Patent
She et al.

(10) Patent No.: US 12,212,331 B2
(45) Date of Patent: Jan. 28, 2025

(54) ANALOG-TO-DIGITAL CONVERTORS POSITIONED ON A SINGLE SEMICONDUCTOR DIE

(71) Applicant: TEXAS INSTRUMENTS INCORPORATED, Dallas, TX (US)

(72) Inventors: Christy Leigh She, Allen, TX (US); Joonsung Park, Allen, TX (US); Krishnasawamy Nagaraj, Ashburn, VA (US); Srinivasa Chakravarthy, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 173 days.

(21) Appl. No.: 17/976,369

(22) Filed: Oct. 28, 2022

(65) Prior Publication Data

US 2024/0146323 A1 May 2, 2024

(51) Int. Cl.
*H03M 1/06* (2006.01)
*H03M 1/08* (2006.01)
(52) U.S. Cl.
CPC .................................. *H03M 1/08* (2013.01)

(58) Field of Classification Search
CPC ............................. H03M 1/08; H03M 1/1245
USPC .......................................... 341/155, 159, 118
See application file for complete search history.

(56) References Cited

U.S. PATENT DOCUMENTS 9,473,158 B1 * 10/2016 Delos ........................ H04B 1/06
2021/0313999 A1 * 10/2021 Atriss ..................... H03M 1/802

FOREIGN PATENT DOCUMENTS

JP         2016076845     *  5/2016    .............. H03M 1/12

* cited by examiner

*Primary Examiner* — Peguy Jean Pierre
(74) *Attorney, Agent, or Firm* — Xianghui Huang; Frank D. Cimino

(57) ABSTRACT

Methods for operating two or more analog-to-digital converters (ADCs) are presented herein. The method may be implemented in an integrated circuit. The integrated circuit may include a first ADC and a second ADC disposed on a single semiconductor die. The integrated circuit may also include logic circuitry operably coupled to the first and second ADCs. For a digital value obtained by conversion, by the first ADC, of a first analog signal sampled by the first ADC during a period of time overlapping with another period of time during which a second analog signal is being converted by the second ADC, the logic circuitry may be configured to cause the digital value to be marked as noisy.

20 Claims, 8 Drawing Sheets

ANALOG-TO-DIGITAL CONVERTORS POSITIONED ON A SINGLE SEMICONDUCTOR DIE

BACKGROUND

Existing microcontrollers may provide two or more analog-to-digital converters (ADC) as, for example, a system on a chip (SoC). In some cases, however, more than one of the ADCs may not be able to be operated at the same time because of the potential for performance degradation. Such degradation in performance of two or more ADCs operating at the same time may include a known phenomenon where the precision of conversion of, for instance, an ADC designed for a 12-bit resulting digital value may decrease to, for example, only an effective 8-bit resulting digital value. This performance degradation may arise from noise, especially during the sensitive end of ADC sampling time. One ADC may make more noise than the other(s) during conversion time when the digital clock is working. Put another way, the aforementioned noise may occur in the system when the end of a sampling period of a first ADC occurs while a second ADC is converting. Known approaches for addressing the aforementioned mode of performance degradation for multiple ADCs include placing each ADC on separate semiconductor dies. That approach, however, increases manufacturing costs and complexity, and may also make resulting products larger in size. Another known approach employs simultaneous operation of multiple ADCs for redundancy, measuring multiple sensors at the same type, or measuring a variety of sensors at the same time. However, this approach does not address multiple processes requiring sampling based on different events, and so still does not allow independent use of two or more ADCs on a single chip by different processes.

SUMMARY

An integrated circuit (IC) is presented herein. The IC has a first analog-to-digital converter (ADC) and a second ADC disposed on a single semiconductor die. The IC also has logic circuitry operably coupled to the first and second ADCs. For a digital value obtained by conversion, by the first ADC, of a first analog signal sampled by the first ADC during a period of time overlapping with another period of time during which a second analog signal is being converted by the second ADC, the logic circuitry is configured to cause the digital value to be marked as noisy.

Further, a method of operating two or more ADCs disposed on a single semiconductor die is presented. The method includes, for a digital value obtained by converting, by a first ADC, a first analog signal sampled by the first ADC during a period of time overlapping with another period of time during which a second ADC is converting a second analog signal, marking the digital value as noisy.

Further, one or more non-transitory computer readable media is disclosed. The one or more non-transitory computer readable media have stored thereon program instructions which when executed by at least one processor of a machine, cause the machine to, for a digital value obtained by conversion, by a first ADC, of a first analog signal sampled by the first ADC during a period of time overlapping with another period of time during which a second analog signal is being converted by a second ADC disposed on a single semiconductor die with the first ADC, cause the digital value to be marked as noisy.

BRIEF DESCRIPTION OF THE DRAWINGS

Embodiments of the present technology will be described and explained through the use of the accompanying drawings in which.

Figure 1:
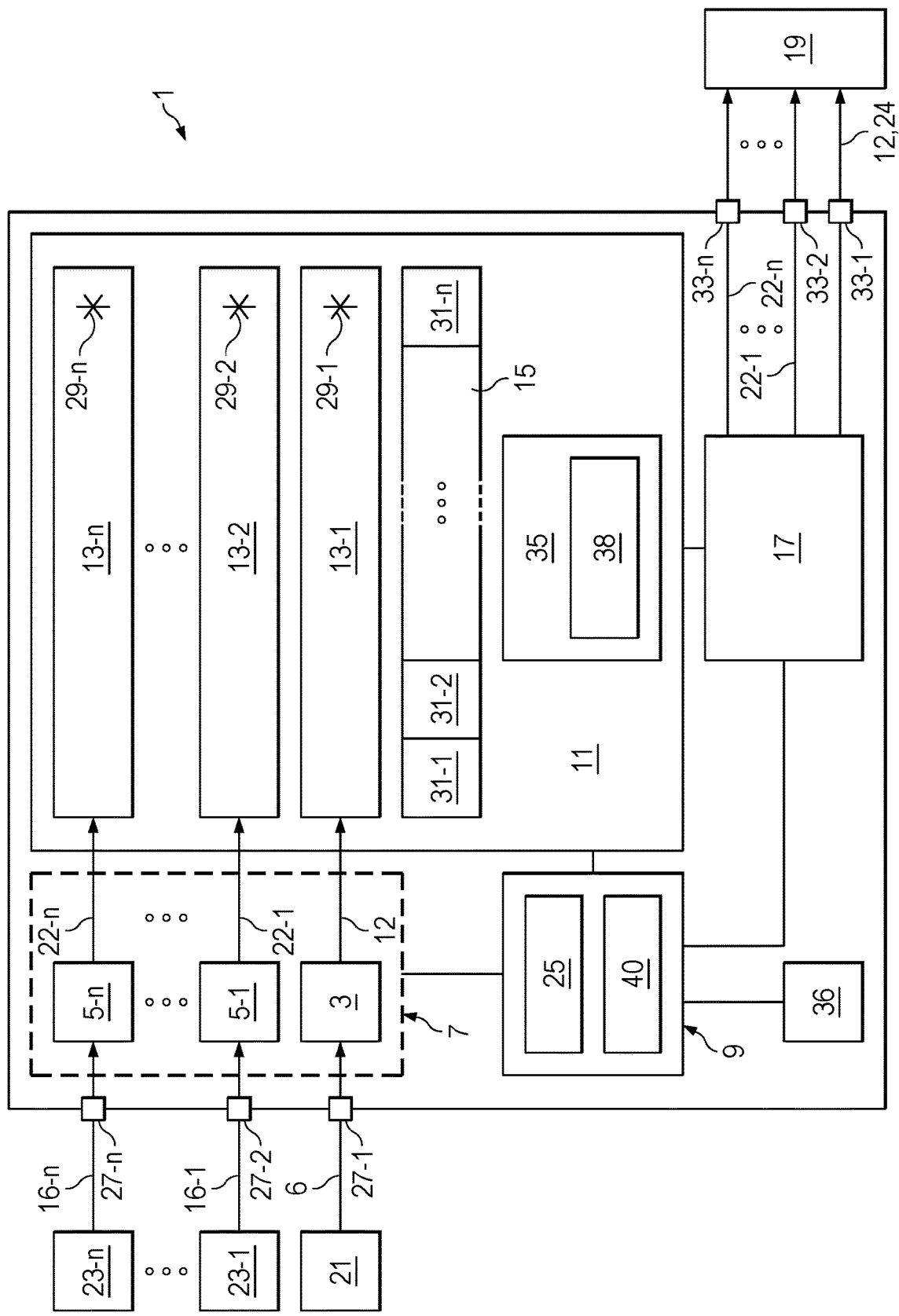
FIG. 1 is a block diagram of an implementation.

The drawings have not necessarily been drawn to scale. Similarly, some components and/or operations may be separated into different blocks or combined into a single block for the purposes of discussion of some of the embodiments of the present technology. Moreover, while the technology is amenable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

As multicore processing becomes more prevalent and multi-modality sensing grows, the need to use multiple on-chip analog-to-digital converters (ADCs) independent of each other for separate processes has increased. Ideally, the ADCs should not affect the performance (e.g., noise floor or maximum sample rate) of each other. The notion of needing security between two or more processes each using an ADC to prevent software of one process from sabotaging the second or running rouge and interfering with the second also necessitates independent use of an ADC by each process. Today, users who need independent use of multiple ADCs without degrading performance use external ADCs which take up more board space and is more costly. For microcontroller (MCU) makers, putting the ADCs on separate silicon is expensive and makes the solution large in size.

In many examples, multiple ADCs on single silicon may not be run independently without sacrificing performance. Known approaches to this problem include limiting multiple ADCs to work simultaneously. This works for redundancy, measuring multiple sensors of the same type, or measuring a variety of sensors at the same time. However, it does not address multiple processes requiring sampling based on different events. Throughput may be sacrificed by not using ADCs at the same time to minimize noise floor. Multiple ADCs may be run at the same time, but timing is not synchronous, so their noise floor increases. ADCs placed in separate silicon dies to provide isolation increases the required surface area and leads to increased sizes and costs for final products (e.g., chips and/or MCUs).

The present technology enables a user to have conversions with increased noise from other ADC(s) during the sensitive end of sample time marked as "noisy" to know that the signal-to-noise ratio (SNR) could be lower and to drop the conversion, post process the noise out, or reconvert the signal (based on application needs) to mitigate the noise from the other ADC(s), and thereby not simply have to accept lower performance or slower maximum sample rate. The present technology allows a cost effective way to have multiple ADCs work independently, maintain deterministic sample rates, and provide the user the information to address any noise from the other ADC by using one or more of the techniques described herein.

Referring now to the drawings, FIG. 1 shows an integrated circuit 1 according to an implementation. The integrated circuit, abbreviated IC 1, may include a first analog-to-digital converter (ADC) 3 and one or more second ADC(s) (e.g., 5-1, . . . , 5-n) disposed on a single semiconductor die 7 (a single silicon die). IC 1 may also include logic circuitry 9 operably coupled to the first and at least a second ADC (5-1, . . . , 5-n). IC 1 may include a plurality of input ports (e.g., 27-1, 27-2, . . . , 27-n). Input ports 27 may enable IC 1 to be operably and/or communicably coupled to one or more electronic device(s) positioned externally with respect to IC 1. In an example, such electronic device(s) may include a first source device 21 coupled, or couplable, to first input port 27-1, and at least a second source device (e.g., 23-1, . . . , 23-n) respectively coupled, or couplable, to the at least a second input port (e.g., 27-2, . . . , 27-n).

In some embodiments, a first analog signal 6 originating at the first source device 21 may be received by first ADC 3 via first input port 27-1, and at least a second analog signal (e.g., 16-1, . . . , 16-n) may be received by the at least a second ADC (e.g., 5-1, . . . , 5-n) via the at least a second input ports (e.g., 27-2, . . . , 27-n). First ADC 3 and second ADC(s) 5 are capable of respectively sampling and converting first analog signal 6 and second analog signal(s) 16 to a first digital value 12 and at least a second digital value (e.g., 22-1, . . . , 22-n).

In some embodiments, a timing of the sampling and/or converting performed by first ADC 3 and second ADC 5 may be dictated and/or controlled, at least in part, by logic circuitry 9. This timing of the sampling may be periodic or asynchronous depending on characteristics or operating parameters of interest of the first 21 and/or second 23 source device(s). In an example, logic circuitry 9 may include, or be operably coupled to, at least one digital and/or analog clock device 36, and the aforementioned timing, and possibly also timing(s) of other processes (e.g., of method 100) implemented by, e.g., IC 1, according to the present technology, may be dictated and/or controlled by logic circuitry 9 in conjunction with the clock 36.

In some embodiments, logic circuitry 9 may include, or be operably coupled to, at least one processor 40. In an example, IC 1 may include at least one memory storage device 11 operably coupled to logic circuitry 9. In one embodiment, memory storage device(s) 11 are also operably coupled to first ADC 3 and second ADC(s) 5. Memory storage device(s) 11 may include one or more non-transitory computer readable media 35 that may store processor 40 executable program instructions 38 (e.g., software and/or firmware code). In embodiments of IC 1 including processor(s) 40, the program instructions 38 may be executed by the processor(s) 40 to cause IC 1 (also referred to herein as a machine) to perform, implement, enable or otherwise facilitate functioning of one or more of the component parts, or combinations thereof, of IC 1 and at least one of the various useful processes (e.g., of method 100) according to the present technology. To similar ends, IC 1 may include digital signal processing (DSP) 25 components as a part of, or operably coupled to logic circuitry 9 and/or processor(s) 40. In an example, DSP 25 components may be at least partially under the control of logic circuitry 9 and/or processor(s) 40. In another example, processor(s) 40 may provide, at least in part, the functionality of either logic circuitry 9 or DSP 25, or both, in IC 1, as well as in method 100, as described below.

As used herein, "processor" or "at least one processor" means analog and/or digital circuitry configured to direct various components of the disclosed electronic circuit (e.g., IC 1) to function according to a predefined logical scheme of operation. In the several examples provided in the present disclosure, processor(s) 40 may, at least in part, utilize the above described program instructions 38 encoded as software and/or firmware and stored in the memory storage device(s) 11 for use by processor(s) 40 to read, write and delete useful data, and to perform processor 40 mediated arithmetical operations of various types so as to achieve the various useful and practically advantageous ends of the present technology for the benefit of users thereof. Examples of processor(s) 40 include microcontrollers, DSPs, general purpose central processing units (CPUs), application specific processors or circuits (e.g., ASICs), and logic devices (e.g., FPGAs), as well as any other type of processing device, combinations, or variations thereof. Processor(s) 40 can be implemented within a single processing device but can also be distributed across multiple processing devices or sub-systems that cooperate in executing program instructions.

Logic circuitry 9, DSP 25, and/or processor(s) 40 may direct the first digital value 12 and the second digital value(s) 22 to be stored in the at least one memory storage device 11. As further described below with reference to FIGS. 2-6, the logic circuitry 9, either alone or in combination with DSP 25 and/or processor(s) 40, may cause first digital value 12 to be marked as noisy when the first digital value 12 is obtained by sampling and conversion, by the first ADC 3, of first analog signal 6 during a period of time where its sampling by first ADC 3 overlaps (e.g., at the tail end of) another period of time during which a second analog signal (e.g., 16-1) is being converted by the second ADC (e.g., 5-1). Said another way, if, during a sampling time of one analog signal by an ADC x of a plurality N of ADCs on a single die, any other ADC of the N ADCs is converting another, different analog signal, a resulting value of the conversion by ADC x of its sample is marked as noisy. The present technology provides different modes for accomplishing that as machine- and/or human-discernible physical tangible effects in the hardware of IC 1.

For example, and without limitation, in one embodiment, the at least one memory storage device 11 of, or operably coupled to, IC 1, may include at least one results register (e.g., 13-1, 13-2, . . . , 13-n). In an example, each results register 13 may receive, e.g., 12, bits to store, at least temporarily (e.g., until such time that method 100 reaches the end state 150, as described below), the respective digital value for the respectively converted sample. Each results register 13 may also include a reserved flag bit (e.g., 29-1, 29-2, . . . , 29-n) for use in indicating (e.g., flagging) whether or not the respective digital value has been marked as noisy according to the present technology. In an example, the last, or first, bit may be reserved in each results register 13 for this purpose. So, for instance, when the first digital value 21 is marked as noisy, logic circuitry 9, alone or in conjunction with DSP 25 and/or processor(s) 40, may cause, or otherwise direct, mediate, enable, or facilitate, the flag bit 29-1 for digital value 12 to be changed from a 0 (zero) to a 1 (or to the same end, from 1 to 0) in results register 13-1. Where none of the second digital values 22 are marked noisy, their respective flag bits (e.g., 29-2, . . . , 29-n) are not changed from 0 to 1 (or likewise from 1 to 0).

As another non-limiting example, at least one memory storage device 11 may include at least one flag register 15, either instead of, or in addition to, the results register(s) 13. In an example, flag register 15 may contain flag bits (e.g., 31-1, 31-2, . . . , 31-n) assigned to store, at least temporarily (e.g., until such time that method 100 reaches the end state 150, as described below), a value indicative of whether or not the first 12 and second (e.g., 22-1, . . . , 22-n) values are marked as noisy. So, for instance, logic circuitry 9, alone or in conjunction with DSP 25 and/or processor(s) 40, may cause, or otherwise direct, mediate, enable, or facilitate, the flag bit 31-1 for digital value 12 to be changed from 0 to 1 (or to the same end, from 1 to 0) in flag register 15. Where none of the second digital values 22 are marked noisy, their respective flag bits (e.g., 31-2, . . . , 31-n) are not changed from 0 to 1 (or likewise from 1 to 0).

It is to be understood that persons having ordinary skill in the art will recognize and appreciate that, although the present disclosure uses the first digital value 12 and the first ADC 3 as compared to a non-noisy second digital value (e.g., 22-1) in the various instructive examples in the description and drawings, analogous processes and useful ends are readily achievable using, and without departing from the scope and spirit of, the present technology in cases where one or more of the second digital sample(s) 22 have been marked as noisy.

In some embodiments, IC 1 may include a communications interface 17 operably coupled to logic circuitry 9. In an example, communications interface 17 may also be operably coupled to memory storage device(s) 11. Communication interface 17 may have wired and/or wireless transmitter and/or transceiver functionality. In some embodiments, IC 1 may include a plurality of output ports (e.g., 33-1, 33-2, . . . , 33-n). The output ports 33 may be communicably and operably coupled, or couplable, to at least one electronic device 19 outside of IC 1. In an example, logic circuitry 9 and/or a memory controller (not shown in FIG. 1) of memory storage device(s) 11 may direct communications interface 17 to transmit one or more of the first digital value 12 and second digital value(s) 22 to electronic device(s) 19 via respective output ports 33-1 and 33-2, . . . , 33-n. In an example, logic circuitry 9 may direct, or otherwise cause, the communications interface 17 to transmit the first digital value 12 and/or the second digital value(s) 22 to electronic device(s) 19 via output port(s) 33 for use by those external device(s) 19 and/or user(s) of IC 1 or the electronic device(s) 19. In some embodiments, digital value(s) 12 and/or 22 may be transmitted outside of IC 1 with associated data and/or encoding representative of an indication that the one or more of those digital value(s) is/are noisy. In other embodiment, the presence, use and nature of signals transmitted by one or more of the output ports (e.g., 33-1, 33-2, . . . , 33-n) by IC 1 according to the present technology may be determined and/or effectuated, at least in part, by one or more subsystems (e.g., electronic device(s) 19) separate and apart from IC 1.

Figure 2:
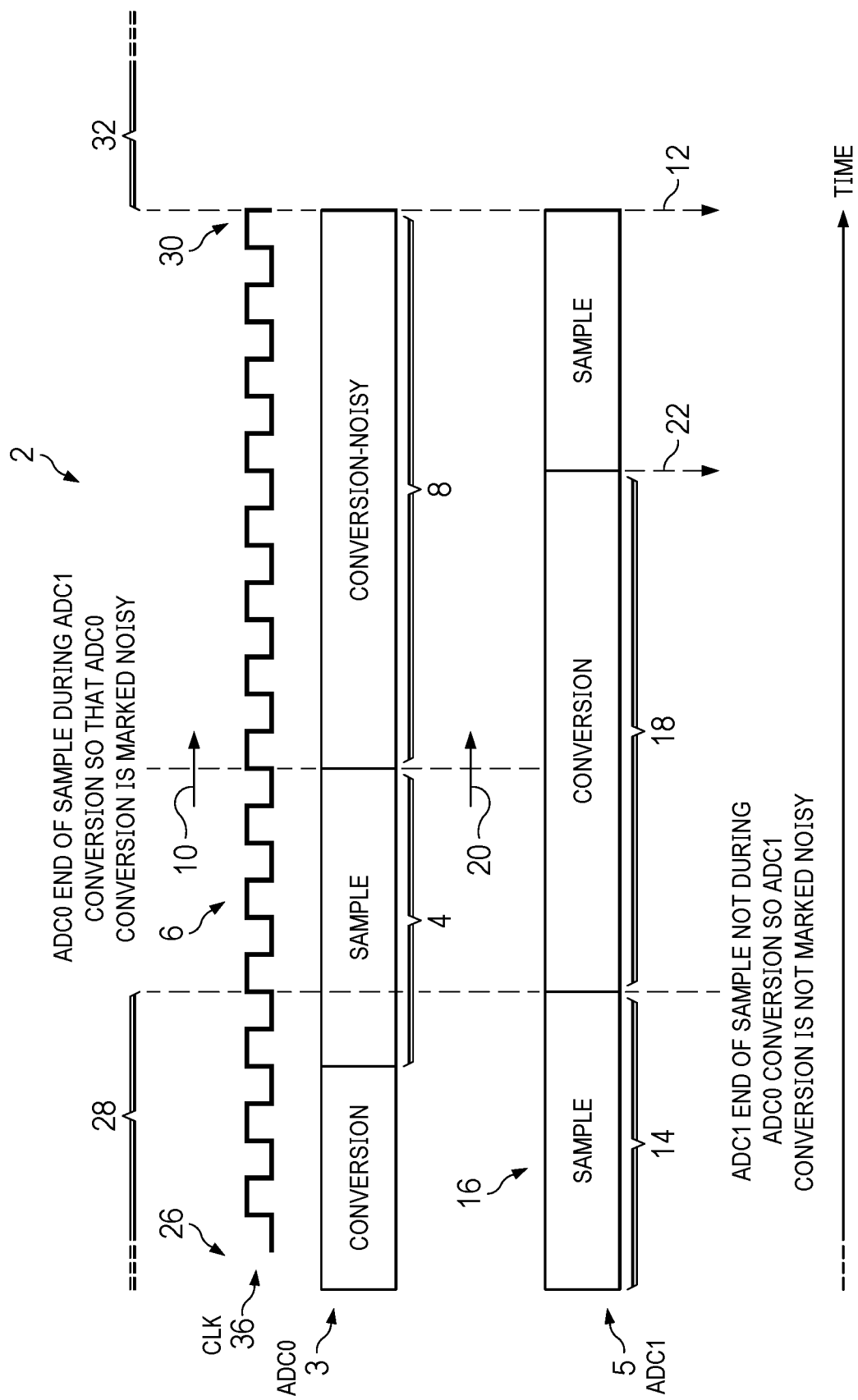
FIG. 2 is a timing diagram of an implementation.
Figure 3A:
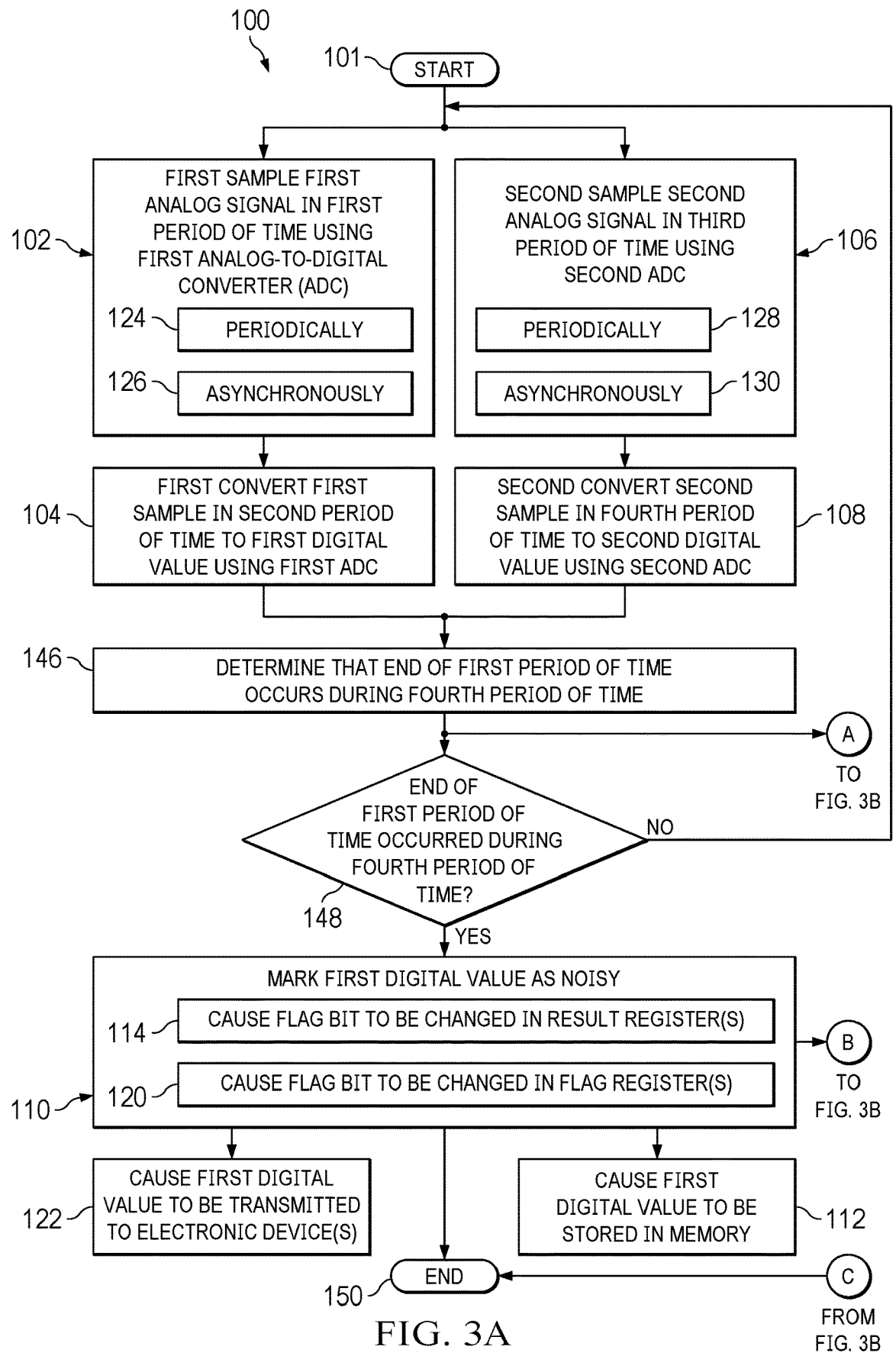
FIGS. 3A and 3B provide an operational sequence of an implementation.
Figure 3B:
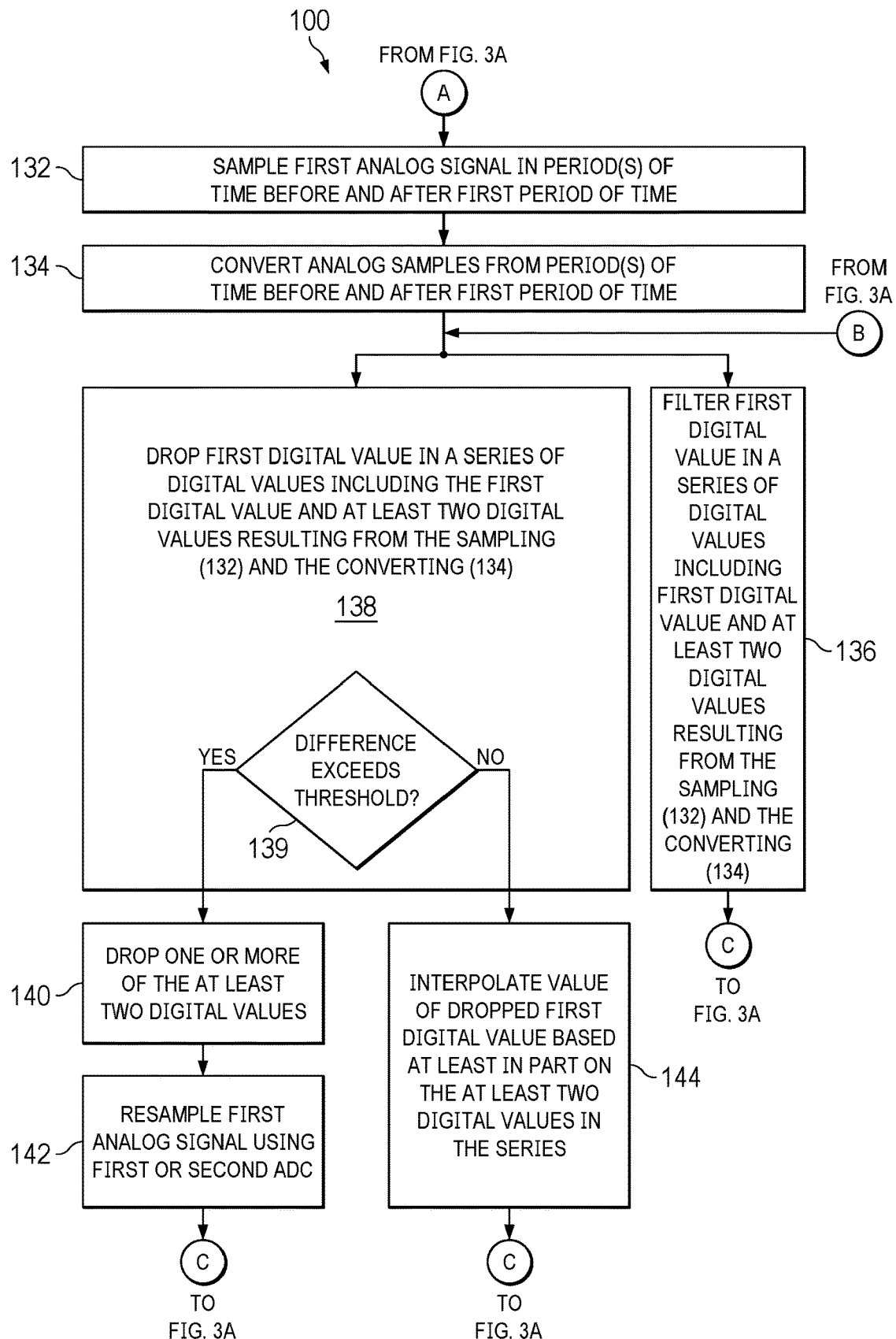
Figure 4:
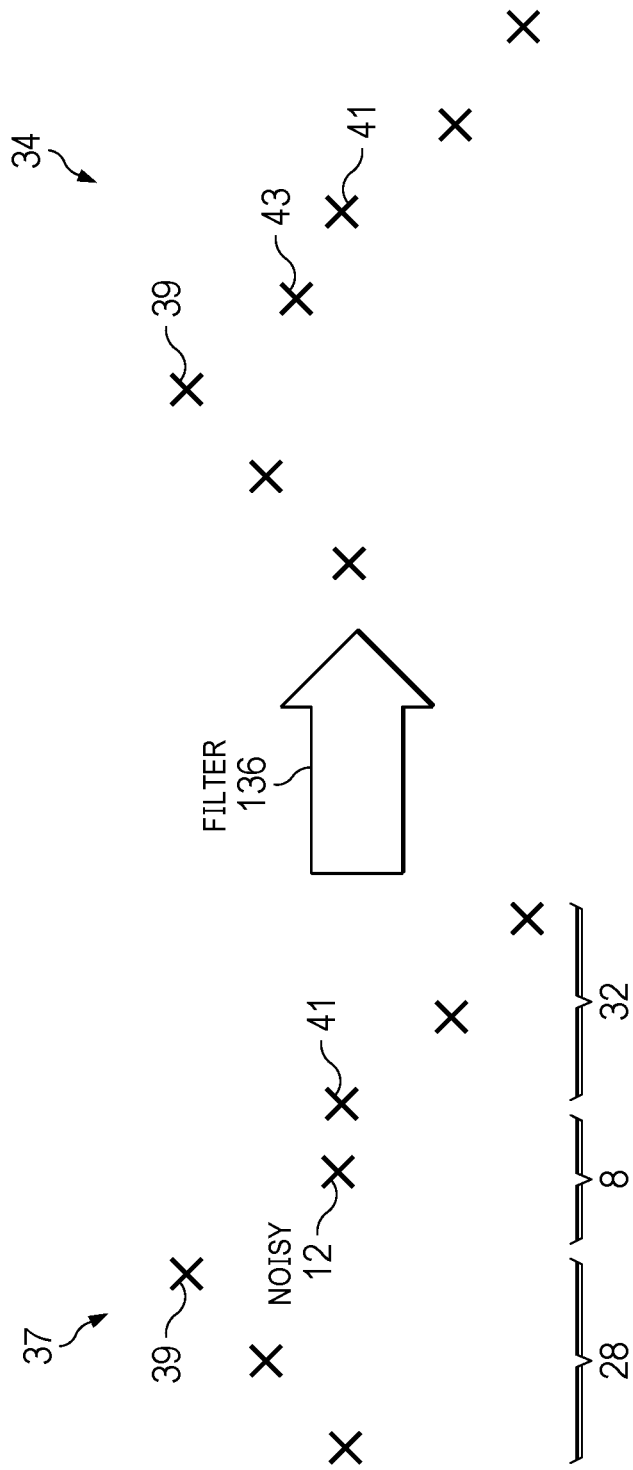
FIGS. 4-6 provide plots of digital values according to some embodiments of the method of FIGS. 3A and 3B.
Figure 5:
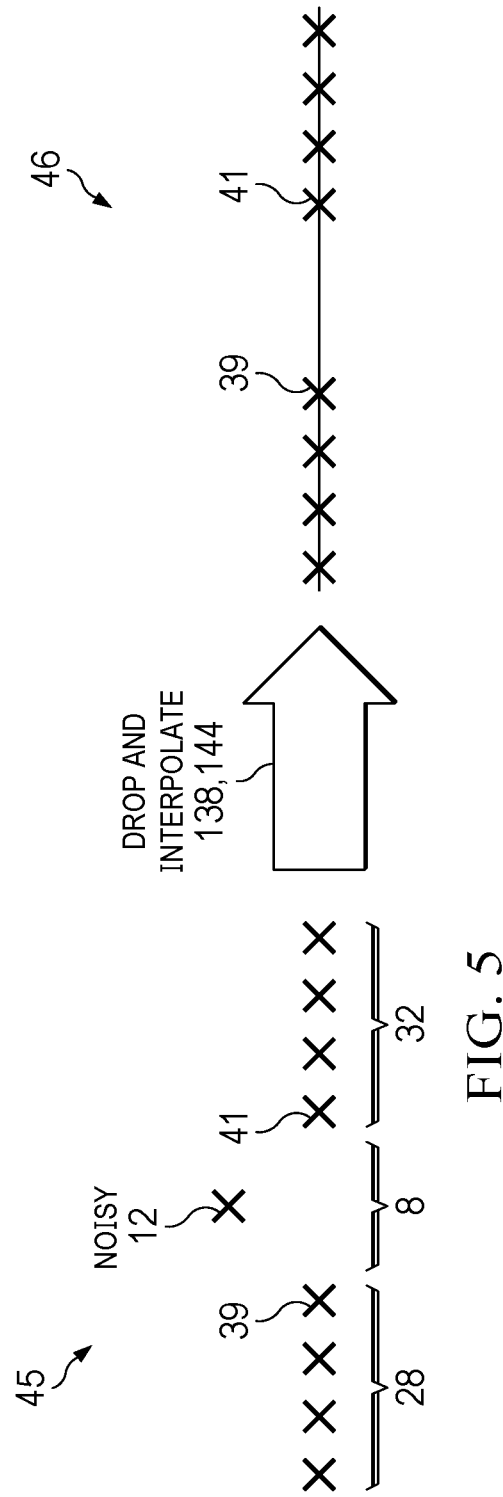
Figure 6:
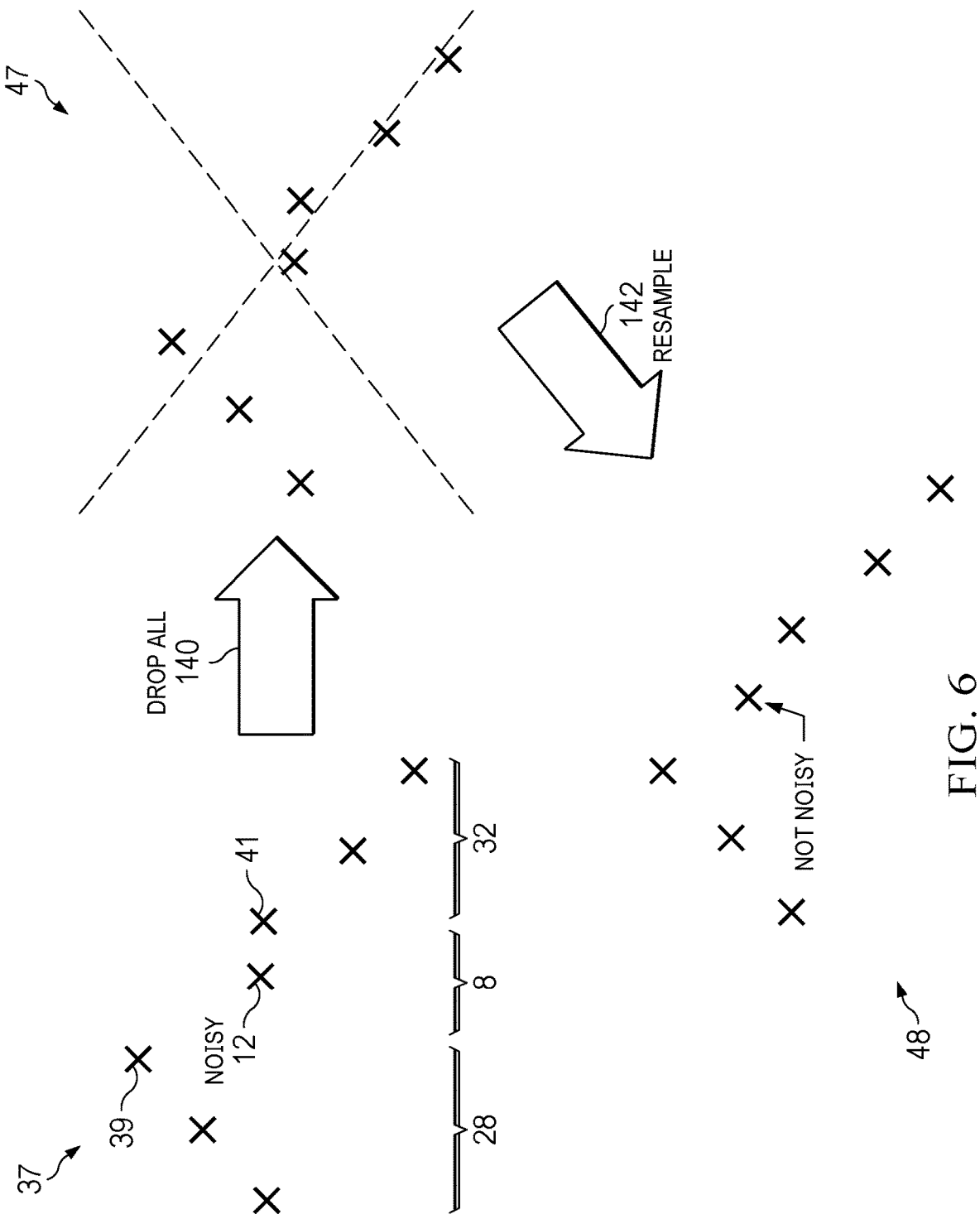

FIG. 2 is a timing diagram of an implementation. FIGS. 3A and 3B provide an operational sequence of a method 100 of operating two or more ADCs (e.g., ADC 3 and ADC 5) according to an implementation of the present technology. FIGS. 4-6 provide plots of digital values from the timing diagram of FIG. 2 and according to some embodiments of method 100 of FIGS. 3A and 3B.

With reference to FIGS. 3A and 3B, and further to FIGS. 1, 2 and 4-6, method 100 may commence from a start state 101. In an example, the start state 101 may coincide with an action by a user of IC 1, such as first powering it on from a powered off state, or similarly IC 1 waking from a sleep or other such power saving mode of operation. Start state 101 may thus represent IC 1 entering into a normal operating state according to the specific application desired by the user of IC 1.

Method 100 may include the step of first sampling 102, in a first period of time 4, a first analog signal 6 using a first ADC (e.g., ADC 3) of the two or more ADCs. Method 100 may also include the step of first converting 104, using the first ADC 3 and in a second period of time 8 consecutive with the first period of time 4, a first sample 10 of the first analog signal 6 to a first digital value 12. In an implementation of the present technology, the first sampling 102 step may include sampling 124 the first analog signal 6 originating from, e.g., first source device 21 on a predetermined periodic basis. For example, and without limitation, ADC 3 may be implemented in a specific application to periodically obtain a reading of a battery voltage. In another implementation of the present technology, the first sampling 102 step may include sampling 126 the first analog signal 6 originating from, e.g., first source device 21, asynchronously. For example, and without limitation, ADC 3 may be implemented in a specific application to sample an input port only during such times that an analog signal exists on that port, as in sampling a microphone.

Method 100 may further include the step of second sampling 106, in a third period of time 14, a second analog signal 16 using a second ADC (e.g., ADC 5) of the two or more ADCs. Method 100 may also include the step of second converting 108, using the second ADC 5 and in a fourth period of time 18 consecutive with the third period of time 14, a second sample 20 of the second analog signal 16 to a second digital value 22. In an implementation of the present technology, the second sampling 106 step may include sampling 128 the second analog signal 16 originating from, e.g., second source device 23 on a predetermined periodic basis. For example, and without limitation, ADC 5 may be implemented in a specific application to periodically obtain a reading of an ambient light level. In another implementation of the present technology, the second sampling 106 step may include sampling 130 the second analog signal 16 originating from, e.g., second source device 23, asynchronously. For example, and without limitation, ADC 5 may be implemented in a specific application to sample an input port only during such times that an analog signal exists on that port, as in sampling environmental sounds exceeding a threshold decibel level.

As the conversion start times may vary independently, some conversions may overlap. In the illustrated example, the conversion by the second ADC 5 begins before the conversion by the first ADC 3. Therefore, an end of the first period of time 4 (the end of the sample phase of the first ADC 3) may occur during the fourth period of time 18 (the conversion phase of the second ADC 5). In an example, method 100 may include the step of determining 146 that the end of the first period of time 4 occurs during the fourth period of time 18. In some embodiments, the determining 146 step may include a logical branch 148. Where it is determined 146 in method 100, as in logical branch 148, that the end of the first period of time 4 did not occur during the fourth period of time 18, method 100 may loop back to the start state 101. In this case, the aforementioned steps of method 100 may be performed again.

Where it is determined 146 in method 100, as in logical branch 148, that the end of the first period of time 4 did occur during the fourth period of time 18, method 100 may proceed to a marking 110 step, in which IC 1 utilizes logic circuitry 9, for example, to mark the first digital value 12 as noisy. In some embodiments, method 100 may also include the step of causing 112, e.g., using logic circuitry 9, the first digital value 12 to be stored in memory of or associated with IC 1 (e.g., memory storage device(s) 11).

In embodiments where memory storage device(s) 11 include(s) at least one results register 13, the marking 110 step of method 100 may include causing 114, e.g., using logic circuitry 9, a flag bit 29 in the at least one results register 13 to be changed. In an example, the causing 114 step may result in a change in the flag bit 29 from a zero (0) to a one (1). In another example, the causing step may result in the change in the flag bit 29 from 1 to 0. In embodiments where memory storage device(s) 11 include(s) at least one flag register 15, the marking 110 step of method 100 may include causing 120, e.g., using logic circuitry 9, a flag bit 31 in the at least one flag register 15 to be changed. In an example, the causing 120 step may result in a change in the flag bit 31 from 0 to 1. In another example, the causing step may result in the change in the flag bit 31 from 1 to 0.

In some embodiments, method 100 may also include the step of causing 122, e.g., using logic circuitry 9, the first digital value 12 to be transmitted, e.g., using communications interface 17 or other capable transmitter or transceiver device, to the electronic device(s) 19. In an example, first digital value 12 may be transmitted with associated data representative of an indication 24 that the first digital value 12 is noisy. Although method 100 is described herein with respect to operations relating to the first digital value 12, persons of ordinary skill in the art can recognize and appreciate that other operations may be performed with respect to the second digital value 22. For example, and without limitation, the second digital value 22 may be stored in memory storage devices 11 and/or may be transmitted to electronic storage device(s) 19 for use by users of IC 1 for purposes other than specifically relating to the present technology. Accordingly, such uses or relating operations with respect to the second digital value are not described in detail herein.

In some embodiments, method 100 may proceed to an end state 150 representative of one of several operating conditions of IC 1, for instance. In an example, method 100 may enter end state 150 upon completing the marking 110 step, and await a signal or command instructing, e.g., logic circuitry 9 to loop back to the start state 101. Such a signal or command may be representative of a clock whereby the clock dictates the sampling and converting rate (e.g., per second) for operating of ADCs 3 and/or 5. In another example, method 100 may enter the end state 150 upon IC 1 being powered off by a user or being caused to enter a sleep or similar power saving mode.

In other embodiments, method 100 may branch to additional operations at points in the sequence of operations that are denoted by the circled "A", "B" and "C" in FIG. 3A. In one embodiment, method 100 may proceed to a branch "A." In an example, method 100 proceeds through branch "A" before or concurrent with logical branch 148. As shown in FIG. 3B, and with further reference to FIGS. 2 and 4-6, in embodiments where branch "A" is performed, method 100 may include the step of sampling 132 the first analog signal 6 and converting 134, using first ADC 3: at least one analog sample 26 in at least one period of time 28 before the first period of time 4; and at least one analog sample 30 in at least one period of time 32 after the first period of time 4. The sampling 132 and converting 134 steps of method 100 may enable or otherwise facilitate operations whereby sequences of digital values (as shown in FIGS. 4-6, for example) that contain at least the first digital value 12 marked 110 as noisy may be addressed according to the present technology, as further described below. Accordingly, as shown in FIGS. 3A and 3B, method 100 may proceed in branch "B" such that the first digital value 12 so marked 110 as noisy may be addressed in the context of the sequence, or series (e.g., 37 or 45), of digital values. In an example, such digital values in series 37 or series 45 may be representative of consecutively converted (e.g., from steps 104 and 134 of method 100) data from consecutive samples (e.g., from steps 102 and 132 of method 100) of an analog signal (e.g., first analog signal 6).

Referring now to FIGS. 3B and 4, in some embodiments, method 100 may include the step of filtering 136 the first digital value 12 in a series 37 of digital values including the first digital value 12 and at least two digital values (39, 41) resulting from the aforementioned sampling 132 and converting 134 steps. As shown in FIG. 4, the first digital value 12 has been marked 110 as noisy. In an example, the filtering 136 step of method 100 may be implemented with a digital filtering scheme using, e.g., DSP components 25 components and/or software/firmware. The filtering 136 may include a nearest neighbor algorithm whereby first digital value 12 is transformed into a modified first digital value 43. In an example, the filtering 136 implemented using DSP 25 may utilize a fast K-nearest neighbor algorithm. A result of the filtering 136 in method 100 is shown in a smoothed series 34 of digital values. Persons having ordinary skill in the art may recognize and appreciate that other digital filtering schemes may be employed for the filtering 136 step of method 100 without departing from the scope and spirit of the present technology. In the illustrated example, the first digital value 12 marked 110 as noisy has its value increased to become modified first digital value 43 by the nearest neighbor algorithm, and the consecutive digital values (39, 43 and 41) are thereby smoothed.

Referring now to FIGS. 3B, 5 and 6, in some embodiments, method 100 may include the step of dropping 138 the first digital value 12 in a series 45 of digital values including the first digital value 12 and at least two digital values (39, 41) resulting from the aforementioned sampling 132 and converting 134 steps. As shown in FIGS. 5 and 6, the first digital value 12 has been marked 110 as noisy. In an example, the dropping 138 step of method 100 may be implemented with a digital filtering scheme using, e.g., DSP components 25 components and/or software/firmware. In an example, instead of relying only on whether or not first digital value is marked 110 noisy, the dropping 138 may include a statistical algorithm that may compute, e.g., in a logical branch 139 of method 100, whether first digital value 12 deviates from an average of the non-noisy digital values corresponding to values 39 and 41 by a predetermined threshold (e.g., magnitude, standard deviation, or percentage). Persons having ordinary skill in the art may recognize and appreciate that other algorithms or computational schemes may be employed for the dropping 138 step of method 100 without departing from the scope and spirit of the present technology.

In one embodiment, as shown in FIG. 5, only a first digital value 12 that is marked 110 as noisy is dropped 138 from the series 45. In this embodiment, method 100 may include the step of interpolating 144 a value of the dropped first digital value 12 based at least on the at least two digital values (39, 41) in the series 45. That is, with the value of the first digital value 12 marked 110 noisy in method 100 dropped 138 from series 45, the algorithm implemented by DSP 25 may simply drop 138 and ignore the first digital value 12 entirely, resulting in a modified series 46.

In an example, the interpolating 144 step of method 100 may be performed in cases where, e.g., DSP 25, computes in logical branch 139 that the aforementioned difference does not exceed the threshold. Although the dropping 138 and interpolating 144 steps of method 100 may be especially well-suited in cases where the value(s) including digital value 39 obtained during time period 28 and the value(s) including digital value 41 obtained during time period 32 may have respective values that are relatively close, e.g., within 0.1%, or 1%, or 10%, of one another, this does not necessarily have to be the case in this embodiment. Depending on the required accuracy and precision of a specific application of method 100 by the user, the dropping 138 and interpolating 144 steps of method may be utilized for series 45 of digital values including first digital value 12 marked 110 noisy that do not differ from one another by more than, e.g., greater than 0.1%, greater than 1%, or greater than 10%.

In another embodiment, as shown in FIG. 6, method 100 may include the step of dropping 140 one or more of the at least two digital values (39, 41) in the series 37 resulting from the aforementioned sampling 132 and converting 134 steps. In the example illustrated in FIG. 6, the dropping 140 step includes dropping 140 all of the digital values in series 37 including first digital value 12 and the digital values obtained in time periods 28 and 32. In this embodiment, DSP 25 may be programmed to effectively delete all data in series 37, resulting in a deleted series 47. In this embodiment, method 100 may further include the step of resampling 142 the first analog signal 6 to provide a resampled series 48. For the resampling 142 step, method 100 may utilize the first 3 or second 5 ADC. In an example, the dropping 140 and resampling 142 steps of method 100 may be performed in cases where, e.g., DSP 25, computes in logical branch 139 that the aforementioned difference exceeds the threshold.

Figure 7:
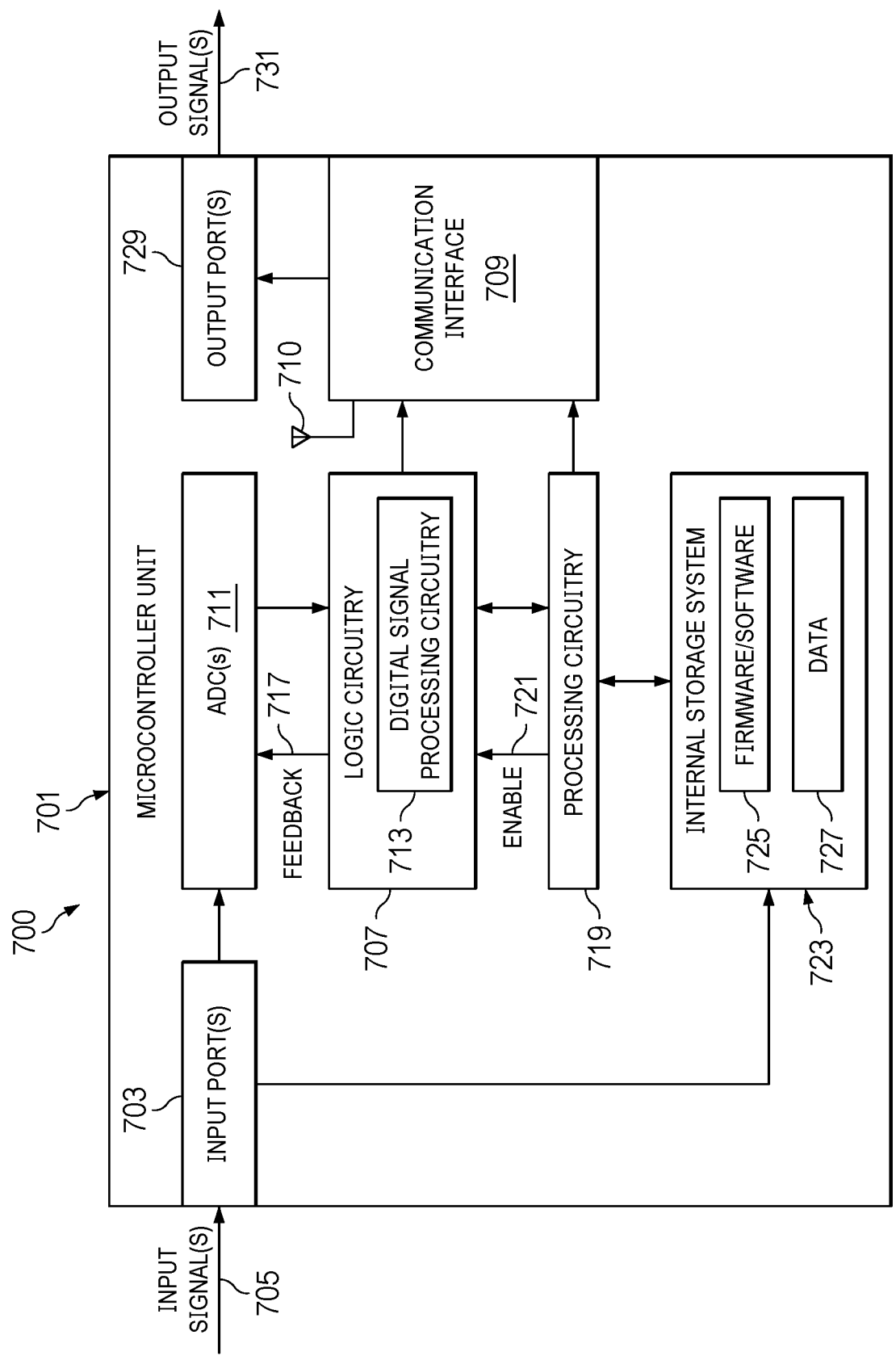
FIG. 7 is a functional view of a system suitable for implementing an implementation.

FIG. 7 illustrates computing system 700 that is representative of any system or collection of systems in which the various processes, programs, services, and scenarios disclosed herein may be implemented. Examples of computing system 700 include, but are not limited to, microprocessors, digital signal processors, integrated circuits, system-on-a-chip (SoC), server computers, routers, web servers, cloud computing platforms, and data center equipment, as well as any other type of physical or virtual server machine, physical or virtual router, container, and any variation or combination thereof. In one embodiment, as shown in FIG. 7, the electronic circuit (e.g., IC 1) may be at least in part embodied in a microcontroller unit 701 configured to provide at least a portion of the functionality of IC 1 and/or method 100 according to the present technology, as described above.

As described above, microcontroller unit 701 may take on any of a wide variety of configurations. Here, a simplified example configuration is provided for an electronic circuit (e.g., IC 1) including logic circuitry 9, DSP 25 and/or processor(s) 40 as described above and embodied in microcontroller unit 701. In the embodiment shown in FIG. 7, microcontroller unit 701 may include input port(s) 703 which may correspond to pin(s) of IC 1. Input port(s) 703 may include circuitry configured to receive input signal(s) 705 from source(s) external to microcontroller unit 701, such as data representative of firmware instructions for use by the master node according to the present technology.

Microcontroller unit 701 may include logic circuitry 707 operably coupled to input port(s) 703 to receive input signal(s) 705 therefrom. Input signal(s) 705 may be sampled by ADCs 711 coupled to and between input port(s) 703 and logic circuitry 707. In some embodiments, input signal(s) 705 may be transmitted via input port(s) 703 to logic circuitry 707 by way of one or more intervening functional components of microcontroller unit 701. In the example illustrated in FIG. 7, such intervening components may include a communications interface 709 coupled to and between output port(s) 729 and logic circuitry 707 and/or processing circuitry 719. Communications interface 709 may have the functionality of a wired and/or wireless transceiver. In an example, a radio frequency antenna 710 may be coupled to communications interface 709 to provide wireless (e.g., WiFi) communications according to the present technology. Logic circuitry 707 may include, or be coupled to, processing circuitry 719. Logic circuitry 707 and/or processing circuitry 719 may be configured to implement or otherwise perform, at least in part, one or more of the functions of the IC 1 and/or method 100 according to the present technology.

In microcontroller unit 701, processing circuitry 719 may be operably coupled to logic circuitry 707. In some embodiments, processing circuitry 719 may correspond to logic circuitry 9, DSP 25 and/or processor(s) 40 of IC 1 as described above. Processing circuitry 719 may include analog and/or digital circuitry components capable of directing logic circuitry 707 and other components of microcontroller unit 701 to implement or otherwise perform, at least in part, one or more of the functions of the IC 1 and/or method 100 according to the present technology. Processing circuitry 719 may also transmit an enable signal(s) 721 to logic circuitry 707 activate all or part of the functionality of the components of microcontroller unit 701. A feedback signal 717 may be transmitted from logic circuitry 707 to the ADCs 711 to, for example and without limitation, control aspects of their operation such their sampling rates and the like. In an example embodiment, receipt of enable signal(s) 721 by logic circuitry 707 may correspond to entry into the start state 101 of method 100.

Microcontroller unit 701 may include an internal storage system 723 operably coupled to processing circuitry 719. Processing circuitry 719 may include microprocessor(s) and other circuitry that retrieves and executes firmware and/or software 725 instruction code stored in internal storage system 723 (e.g., on or in non-transitory computer readable media 35). Examples of processing circuitry 719 include, for example and without limitation, general purpose central processing units, application specific processors, and logic devices, as well as any other type of processing device, combinations, or variations thereof. Processing circuitry 719 can be implemented within a single processing device but can also be distributed across multiple processing devices or sub-systems that cooperate in executing program instructions.

Internal storage system 723 can comprise any non-transitory computer readable storage media capable of storing firmware and/or software 760 that is executable by processing circuitry 719. Internal storage system 723 can also include various data structures 727 which comprise one or more registers, databases, tables, lists, or other data structures. Storage system 723 can include volatile and nonvolatile, removable and non-removable media implemented in any method or technology for storage of information, such as computer readable instructions, data structures, program modules, or other data. In this example embodiment, internal storage system 723 includes flash memory within microcontroller unit 701 which may also store configuration information for IC 1 and its various components.

Storage system 723 can be implemented as a single storage device but can also be implemented across multiple storage devices or sub-systems co-located or distributed relative to each other. Storage system 723 can comprise additional elements, such as a controller, capable of communicating with processing circuitry 719. Examples of storage media include random access memory, read only memory, magnetic disks, optical disks, flash memory, virtual memory and non-virtual memory, magnetic cassettes, magnetic tape, magnetic disk storage or other magnetic storage devices, or any other medium which can be used to store the desired information and that can be accessed by an instruction execution system, as well as any combination or variation thereof.

Firmware and/or software 725 can be implemented in program instructions and among other functions can, when executed by microcontroller unit 701 in general or processing circuitry 719 in particular, direct microcontroller unit 701, or processing circuitry 719, to operate as described herein according to the present technology. Firmware and/or software 725 can include additional processes, programs, or components, such as operating system software, database software, or application software. Firmware and/or software 760 can also include firmware or some other form of machine-readable processing instructions executable by elements of processing circuitry 719. In at least one example implementation, the program instructions include various modules configured to direct processing circuitry 719 and/or logic circuitry 707 to at least partially implement or otherwise perform the functionality of IC 1 and processes of method 100.

In general, firmware and/or software 725 can, when loaded into processing circuitry 719 and executed, transform processing circuitry 719 overall from a general-purpose computing system into a special-purpose computing system customized to operate as described herein for a microcontroller unit 701 according to the present technology. Encoding firmware and/or software 725 on internal storage system 723 can transform the physical structure or state of internal storage system 723. The specific transformation of the physical structure or state can depend on various factors in different implementations of this description. Examples of such factors can include, but are not limited to the technology used to implement the storage media of internal storage system 723 and whether the computer-storage media are characterized as primary or secondary storage.

For example, if the computer-storage media are implemented as semiconductor-based memory, firmware and/or software 725 can transform the physical state of the semiconductor memory when the program is encoded therein. For example, firmware and/or software 725 can transform the state of transistors, capacitors, or other discrete circuit elements constituting the semiconductor memory. A similar transformation can occur with respect to magnetic or optical media. Other transformations of physical media are possible without departing from the scope of the present description, with the foregoing examples provided only to facilitate this discussion.

At least one output signal(s) 731 encoding data representative of results of, e.g., arithmetical, operations performed by processing 719 and/or logic circuitry 707 may be transmitted outside of microcontroller unit 701 via one or more output ports 729 by communications interface 709. In some embodiments, communications interface 709 may take the aforementioned signal(s) 731 from logic circuitry 707 and subsequently cause them to be transmitted out of microcontroller unit 701 via output port(s) 729. In other embodiments, logic circuitry 707 and/or processing circuitry 719 includes at least a part of the functionality of communications interface 709 and, as such, the aforementioned signal(s) 731 may be transmitted directly outside of microcontroller 701 by logic circuitry 707 and/or processing circuitry 719 via output port(s) 729. In an example, logic circuitry 707 may include DSP circuitry 713.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the disclosure. Those skilled in the art will also appreciate that the features described above may be combined in various ways to form multiple embodiments. As a result, the invention is not limited to the specific embodiments described above, but only by the claims and their equivalents.

What is claimed is:

1. An integrated circuit comprising:
   a semiconductor die that includes:
      a first ADC configured to:
         receive a first analog signal; and
         provide a first digital value based on the first analog signal by:
            sampling the first analog signal during a first period of time to produce a first sampled signal; and
            performing a conversion on the first sample signal;
      a second ADC configured to:
         receive a second analog signal; and
         provide a second digital value based on the second analog signal by:

sampling the second analog signal to produce a second sampled signal; and
performing a conversion on the second sample signal during a second period of time;
logic circuitry coupled to the first ADC and the second ADC and configured to:
determine whether the first period of time overlaps with the second period of time; and
determine whether to mark the first digital value as noisy based on whether the end of the first period of time overlaps with the second period of time.

2. The integrated circuit of claim 1, wherein the logic circuitry is further configured to determine that an end of the first period of time occurs during the second period of time.

3. The integrated circuit of claim 1, wherein the logic circuitry is further configured to:
cause the first digital value to be marked as noisy by causing a flag bit in at least one results register to be:
changed from 0 to 1; or
changed from 1 to 0.

4. The integrated circuit of claim 1 further comprising a communications interface, wherein the logic circuitry is further configured to cause the first digital value to be marked a noisy by transmitting, using the communications interface, the first digital value to at least one electronic device with associated data representative of an indication that the first digital value is noisy.

5. The integrated circuit of claim 1, wherein the first ADC is further configured to sample the first analog signal and convert:
at least one analog sample in at least one period of time before the first period of time; and
at least one analog sample in at least one other period of time after the first period of time.

6. The integrated circuit of claim 5, wherein the logic circuitry is further configured to cause the first digital value to be filtered in a series of digital values including the first digital value and at least two digital values resulting from the at least one analog sample in the at least one period of time before, and the at least one other period of time after, the first period of time being sampled and converted.

7. The integrated circuit of claim 5, wherein the logic circuitry is further configured to cause the first digital value to be dropped in a series of digital values including the first digital value and at least two digital values resulting from the at least one analog sample in the at least one period of time before, and the at least one other period of time after, the first period of time being sampled and converted.

8. The integrated circuit of claim 7, wherein the logic circuitry is further configured to cause one or more of the at least two digital values to be dropped in the series.

9. The integrated circuit of claim 7, wherein the logic circuitry is further configured to cause all of the at least two digital values to be dropped in the series.

10. The integrated circuit of claim 8, wherein the logic circuitry is further configured to cause the at least one of the first ADC and the second ADC to resample the first analog signal.

11. The integrated circuit of claim 7, wherein the logic circuitry is further configured to cause a value of a dropped digital value to be interpolated based at least on the at least two digital values in the series.

12. A method of operating two or more analog-to-digital converters (ADCs) disposed on a single semiconductor die, the method comprising:
receiving, by a first ADC, a first analog signal;
sampling, by the first ADC, the first analog signal during a first period of time to produce a first sampled signal;
converting, by the first ADC, the first sampled signal to provide a first digital value based on the first sampled signal;
receiving, by a second ADC, a second analog signal;
sampling, by the second ADC, the second analog signal to produce a second sampled signal;
converting, by the second ADC, the second sampled signal during a second period of time to provide a second digital value based on the second sampled signal;
determining whether the first period of time overlaps with the second period of time; and
determining whether to mark the first digital value as noisy based on whether the end of the first period of time overlaps with the second period of time.

13. The method of claim 12 further comprising determining that the end of the first period of time occurs during the second period of time.

14. The method of claim 12 further comprising sampling, by the first ADC the first analog signal, and converting, by the first ADC:
at least one analog sample in at least one period of time before the first period of time; and
at least one analog sample in at least one period of time after the first period of time.

15. The method of claim 14 further comprising filtering the first digital value in a series of digital values including the first digital value and at least two digital values resulting from the sampling and converting of the at least one analog sample in the at least one period of time before, and the at least one other period of time after, the first period of time.

16. The method of claim 14 further comprising dropping the digital value in a series of digital values including the first digital value and at least two digital values resulting from the sampling and converting of the at least one analog sample in the at least one period of time before, and the at least one other period of time after, the first period of time.

17. The method of claim 16 further comprising dropping one or more of the at least two digital values.

18. The method of claim 17 further comprising resampling the first analog signal using the first, or the second, ADC.

19. The method of claim 16 further comprising interpolating a value of a dropped digital value based at least on the at least two digital values in the series.

20. One or more non-transitory computer readable media having stored thereon program instructions which when executed by at least one processor of a machine, cause the machine to:
determine whether a first period of time during which a first ADC samples a first analog signal for conversion into a first digital value overlaps with a second period of time during which a second ADC converts a sampled second analog signal into a second digital value; and
determine whether to mark the first digital value as noisy based on whether the end of the first period of time overlaps with the second period of time.

* * * * *